(12) United States Patent
Brinkmann

(10) Patent No.: US 8,701,060 B2
(45) Date of Patent: Apr. 15, 2014

(54) DIGITAL CIRCUIT VERIFICATION MONITOR

(75) Inventor: Raik Brinkmann, München (DE)

(73) Assignee: Onespin Solutions, GmbH, Munich (DE)

( * ) Notice: Subject to any disclaimer, the term of this patent is extended or adjusted under 35 U.S.C. 154(b) by 0 days.

(21) Appl. No.: 13/457,240

(22) Filed: Apr. 26, 2012

(65) Prior Publication Data

US 2013/0019217 A1    Jan. 17, 2013

Related U.S. Application Data

(60) Provisional application No. 61/506,249, filed on Jul. 11, 2011.

(30) Foreign Application Priority Data

Jul. 11, 2011   (EP) ..................................... 11173498

(51) Int. Cl.
G06F 9/455   (2006.01)
G06F 17/50   (2006.01)

(52) U.S. Cl.
USPC .............................. 716/106; 716/111; 716/136

(58) Field of Classification Search
USPC .......................................... 716/106, 111, 136
See application file for complete search history.

(56) References Cited

U.S. PATENT DOCUMENTS

| | | | |
|---|---|---|---|
| 6,163,876 A | 12/2000 | Ashar et al. | |
| 6,484,134 B1 | 11/2002 | Hoskote | |
| 6,594,804 B1 | 7/2003 | Hojati | |
| 7,454,726 B2 * | 11/2008 | Lam et al. | 716/106 |
| 7,818,700 B2 | 10/2010 | Muller-Brahms | |
| 7,836,416 B2 | 11/2010 | Schubert et al. | |
| 2007/0124712 A1 * | 5/2007 | Liu et al. | 716/5 |
| 2007/0226663 A1 | 9/2007 | Bormann et al. | |
| 2008/0059925 A1 | 3/2008 | Seigler et al. | |
| 2008/0072207 A1 * | 3/2008 | Verma et al. | 716/21 |
| 2009/0319252 A1 | 12/2009 | De et al. | |
| 2010/0199237 A1 * | 8/2010 | Kim et al. | 716/3 |
| 2011/0214095 A1 * | 9/2011 | Gowda et al. | 716/102 |

OTHER PUBLICATIONS

Chockler et al., "Coverage Metrics for Formal Verification," 2003.
Metzdorfer, "Implementierung eines Fehlerinjektors für Hardware Mutations Analysis und Anwendung in der Vollständigen Formalen Hardwareverifkation," Kaiserslautern 2010.
Fallah et al., "Occom: Efficient Computation of Obersvability-Based Code Coverage Metrics for Functional Verification," 35th Design Automation Conference (1998).

* cited by examiner

*Primary Examiner* — Nha Nguyen
*Assistant Examiner* — Brian Ngo
(74) *Attorney, Agent, or Firm* — 24IP Law Group; Timothy R. DeWitt

(57) ABSTRACT

A method, a system and a computer readable medium for providing information relating to a verification of a digital circuit. The verification may be formal verification and comprise formally verifying that a plurality of formal properties is valid for a representation of the digital circuit. The method comprises replacing at least a first input value relating to the representation of the digital circuit by a first free variable, determining if at least one of the plurality of formal properties is valid or invalid after replacing the first input value by the first variable and indicating if the at least one of the plurality of formal property is valid or invalid. The use of a free or open variable that has not determined value can be directly in the description or representation of the digital circuit. It is not necessary to insert errors or to apply an error model.

15 Claims, 3 Drawing Sheets

DIGITAL CIRCUIT VERIFICATION MONITOR

CROSS-REFERENCE TO RELATED APPLICATIONS

The present application claims the benefit of the filing date of U.S. Provisional Patent Application Ser. No. 61/506,249 filed by the present inventor on Jul. 11, 2011.

The aforementioned provisional patent application is hereby incorporated by reference in its entirety.

BACKGROUND OF THE INVENTION

1. Field of the Invention

The present disclosure relates to the verification of digital circuits. In particular, the present disclosure relates to a method and a system for determining the progress and/or the quality of a formal verification process of digital circuit designs.

2. Background and Related Art

Digital circuits such as processors or application specific integrated circuits (ASICS) have become increasingly complex over the last decades. Engineers developing, designing and testing digital circuits have to ensure that a digital circuit has the required functionality and that bugs or malfunctions are excluded as far as possible. The design of a digital circuit should thus be verified before the actual production starts to avoid costs for erroneous circuits having undetected bugs. Simulation of a digital circuit design was therefore frequently applied in order to simulate the function of a digital circuit design. Computing a simulation can be time consuming and expensive with modern complex designs.

Formal verification of digital circuits has become an alternative or complementary tool to simulation of digital circuits. Verification of a digital circuit is usually performed during the design of a digital circuit to verify that the planned design provides the desired functionality without relevant bugs. Formal verification uses formal assertions or formal properties which describe aspects of behaviour of the digital circuit design. A set of the formal assertions or formal properties is used to describe the behaviour of functions of the digital circuit. The digital circuit is then verified by formally verifying that each one of the formal properties holds for the description of the digital circuit design.

In many cases a design is described at the register transfer level (RTL) using languages such as VHDL, Verilog, SystemVerilog, C, C++, System C or others.

It is important to know whether a design has been completely verified or has been verified to an extent that verification can be considered sufficiently complete and safe.

State of the art literature determines the coverage of a verification process by determining whether enough assertions or properties have been established to cover the entire behaviour of the design. A summary of the known methods is given in the article "Coverage Metrics for Formal Verification" by H. Chockler et al. Proceedings of CHARME, 2003

European Patent EP 1 764 715, also published as US 2007/0226663 describes a method for the determination of the quality of a set of formal properties used in formal verification.

U.S. Pat. No. 6,484,134 discloses a method for determining the property coverage. This method determines which functions of a digital circuit are actually covered by the properties.

All of the above prior art relates to the problem of property coverage, i.e. to the questions whether the formal properties used in formal verification are sufficient to describe the complete behaviour of the digital circuit under verification. While there is a wide state of the art relating to the formal properties or assertions, there is no reliable method or system for determining the progress of a verification process on the description of a digital circuit design.

U.S. Pat. No. 6,594,804 describes a system to provide static coverage analysis. This disclosure teaches a system that determines what portions of a circuit design can and cannot be verified using a given set of properties. This method relates to a signal coverage and tries to identify uncovered signals. A signal is determined uncovered if a change in the gate driving the signal does not change the outcome of verification. In the case of U.S. Pat. No. 6,594,804 either '0' or '1' is input and the propagation of the signal synthesised hardware description of a design.

The proposed method can only be applied to a synthesised hardware design and cannot be applied to a RTL description. In other words the method of U.S. Pat. No. 6,594,804 can only be applied at a later stage of the design and cannot be used at the RTL level. Furthermore, it is necessary to repeat the analysis for each individual fault independently, which requires considerable computing resources time and costs.

It is an object of the present invention to overcome the disadvantages of prior art. It is another object of the present disclosure to provide a method, a system and a computer program product for determining the status of a formal verification process of a design under verification.

SUMMARY OF THE INVENTION

The present disclosure suggests a method, a system and a computer readable medium for providing information relating to a verification of a digital circuit. The verification may be formal verification and comprise formally verifying that a plurality of formal properties is valid for a representation of the digital circuit. The method comprises replacing at least a first input value relating to the representation of the digital circuit by a first free variable, determining if at least one of the plurality of formal properties is valid or invalid after replacing the first input value by the first variable and indicating if the at least one of the plurality of formal properties is valid, invalid or unknown. The use of a free or open variable that has an undetermined value can be directly implemented in the description or representation of the digital circuit. It is not necessary to insert errors or to apply an error model.

The method allows determining and providing information about the progress of a verification process. The portion of covered and uncovered statements in the representation of the digital circuit can be determined and can be displayed for example by assigning different colours to the statements.

The determining if at least one of the plurality of formal properties is valid or invalid may comprise determining if at least one of the plurality of formal properties is disproved with the first free variable. If at least one of the plurality of formal properties is disproved, the indicating if the at least one of the plurality of formal properties is valid, invalid or unknown may indicate that the first input value is covered.

The determining if at least one of the plurality of formal properties is valid or invalid may also comprise determining if each one of the plurality of formal properties is proved with the first free variable. If each one of the plurality of formal properties is proved, the indicating may indicate that the first input value is uncovered.

The indicating may further comprise indicating that a coverage of the first input value is not determined or undetermined if none of the plurality of formal properties is disproved and at least one of the plurality of formal properties cannot be proven. Alternatively the indicating may comprise indicating that a coverage of the first input value is determined to a lower limit if none of the plurality of formal properties is disproved and one or more of the plurality of formal properties cannot be proven.

The first input value may be a first signal assignment. The signal assignment may be a syntax tree derived or generated from a design description of the digital circuit. The design description can be a Register Transfer Level (RTL) code. The method can thus be used with the RTL code directly and it not necessary to synthesize a hardware design in order to determine the verification progress.

The method may be repeated with at least a second input value or a second signal assignment and may be continued until a predetermined set of signal assignments has been checked.

The method may further comprise excluding one or more signal assignments from the representation of the digital circuit. Thus, signal assignments that can not be reached or that can not occur at all or that can not occur if a constraint is applied can be excluded to simplify the method. It is possible to exclude signal assignments that can not be controlled.

The method may also comprise excluding at least one portion of the description of the digital circuit from the method that has no influence on the functionality of the digital circuit. Portion or statement of the description that are redundant or that are only present for verification purposes can be excluded to accelerate the method.

The method may also comprise one or more constraints relating to one or more properties. The constraints can be formal constraints, formal assumptions and may have the form of SVA, PSL, ITL, TiDAL or C-asserts.

The disclosure also realest to a system and to a computer readable medium for executing the method.

BRIEF DESCRIPTION OF THE FIGURES

The present invention may be better understood when reading the detailed description of examples of the disclosure that refer to the accompanying figures in which.

DETAILED DESCRIPTION

The present invention may be better understood when reading the following description of examples of the implementation of the present invention. A person skilled in the art should understand that the features described in relation to one example can be combined with other examples and that not all features need to be implemented for implementing the present invention.

Figure 1:
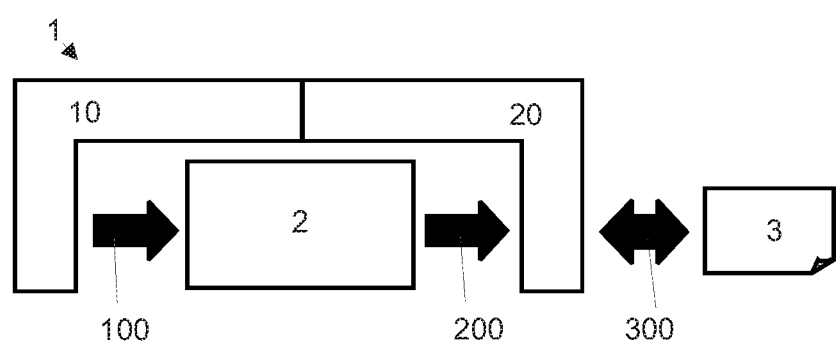
FIG. 1 shows a verification environment in which the system and method of the present disclosure may be used.

FIG. 1 shows a verification environment in which the system and method of the present disclosure may be used. The verification environment 1 is used to verify a design 2 of a digital circuit. The digital circuit design 2 may also be termed design under verification (DUV). The digital circuit design 2 may be represented or described with a register transfer level (RTL) code, such as VHDL, Verilog, SystemVerilog, C, C++, SystemC or other languages or codes known for the description of digital circuits. The description of the digital circuit design 2 may comprise a plurality of statements describing the digital circuit. The digital circuit may be a processor, and ASIC or any other digital circuit that should be verified.

The verification environment further comprises a stimulus generator 10 for activating functions of the digital circuit design 2. The verification environment 1 further comprises a checker for checking 200 if the functions of the digital circuit design 2 activated by the stimulus generator 10 have the expected behaviour. In case of formal verification, the checker is a property checker which formally verifies formal properties or assertions 20 defined for the specific digital circuit design 2 under verification, also termed property checking 200. The general concept of formal properties and property checking 200 is known in the art.

Formal verification usually tests all possible inputs to the digital circuit design 2 and verifies the complete possible behaviour of the digital circuit design 2. Some of the inputs however, are unrealistic or will never occur in practice or there might be known stimuli that will not lead to a desired outcome. Therefore some of the stimuli or inputs may be put under formal constraints also termed formal assumptions or formal constraints for example in the form of SVA, PSL, ITL, TiDAL, C-asserts or the like.

After a digital circuit design 2 is verified by the checker 20, the verified design is compared to a specification 3 of the design to ensure that the functionality defined in the specification is actually provided by the digital circuit design 2. This check 300 against the specification 3 can be done on the RTL description or on a higher or lower level description of the digital circuit, for example after synthesis of the design. These aspects are explained and elsewhere and are known in the art.

The present disclosure relates to the question whether and when the formal verification is sufficiently covered i.e. if and when the verification covers the relevant functional states of the digital circuit. Most of the work carried out so far focuses on the formal properties used in the property checking 200. Prior art focuses on the questions whether enough properties and whether the correct properties have been designed and used that actually describe the complete behaviour of the digital circuit design and thus of the final circuit. This relates to the so-called observability. Observability relates to the questions if effects of exercising statements made in the description of the digital circuit design 2 can actually be observed. This is, however, only one aspect of coverage.

Another aspect relating to the question if a verification process is complete, i.e. covered relates to the aspect, whether the inputs or stimuli generated by stimulus generator 10 actually cover all statements of the description of the digital circuit design 2. The stimulus generator 10 generates and exercises statement in the description of the digital circuit design 2. This may be termed controllability.

For example, it may be interesting for a digital circuit developer to know how many and which statements are actually observed or "covered" by the assertions. This may enable the developer to select the correct assertions or to add or remove assertions from the verification process. Such an analysis is termed coverage analysis herein.

The coverage analysis method and system of the present disclosure proposes a method and a system for indicating which parts of a representation of the digital circuit can be reached by the stimuli or input. and the method and the system can also indicate if the representation of the digital circuit is given in the form of an RTL code, which statements in the RTL code can be and which statement can not covered by assertions. The coverage analysis method is based on the principle of counter factual causality. Counter factual causality comprises the principle that the relation of two statements is: X is a reason for Y to happen. If X is not present, Y would not happen. If this principle is applied to everyday life it may have the form in a simplified and illustrative example: X1: "it rains", X2: "I am outside" X3: "today is Friday". A corresponding example for Y is "I am getting wet". In this case X1 and X2 are reasons for getting wet, i.e. that Y is fulfilled. This principle of counter factual causality will become far more complex if the behaviour and functionality of a digital circuit is considered.

The principle of counter factual causality is applied in order to determine the coverage of a digital circuit design 2 description using formal properties or formal assertions. A signal assignment s is verified by a formal property or formal assertion p if the signal assignment s is a reason for the formal property p being valid on the digital circuit design 2. One or more constraints c may be applied and the signal assignment s may only be a reason for the formal property p being valid on the digital circuit design 2 if the all constraints c of a set of constraints C are applied. If the formal property is valid for the circuit design 2, the corresponding signal assignment s can be termed "covered" by the formal property p. A signal assignment s may have the form of a "variable:=value", assigning the value to the variable. The description of the digital circuit design 2 usually comprises a plurality of signal assignments $s_i$ forming a set of signal assignments S. In some circuit designs 2, signal assignments $s_i$ need to be executed sequentially or in parallel and the signal assignments $s_i$ have to be verified in the correct relation to each other.

While a signal assignment $s_i$ usually assigns a defined value to the variable, the present disclosure suggest to assign a free variable v. This free variable signal assignment $s_i\_v$ may have the form "variable:=free variable v". No specific value is assigned and the free variable v is maintained in the free variable signal assignment $s_i\_v$.

The method now checks whether the free variable signal assignment $s_i\_v$ violates a formal property $p_j$. If the formal property $p_j$ is not violated the signal assignment $s_i$ corresponding to the free variable signal assignment $s_i\_v$ is not a reason for the formal property $p_j$ being valid. The signal assignment $s_i$ is then considered "uncovered". In contrast, if the formal property $p_j$ is violated by the free variable signal assignment $s_i\_v$, the signal assignment $s_i$ is a reason for the formal property $p_j$ being valid. This means that a counter example has been determined and the signal assignment $s_i$ can be considered "covered" by the corresponding property $p_j$.

It is sufficient to identify one formal property $p_j$ from a set of formal properties P that covers the signal assignment $s_i$, i.e. one counterexample that the free variable signal assignment $s_i\_v$ violates a formal property $p_j$, in order to determine that the signal assignment $s_i$ a is covered. On the other hand a signal assignment $s_i$ can only be determined "uncovered" if none of the formal properties $p_j$ of the set of formal properties P is violated by the free variable signal assignment $s_i\_v$. This is the case if each formal property $p_i$ of the set of formal properties P this signal assignment $s_i$ is determined as uncovered.

The above method can now be repeated for all signal assignments $s_i$ of a set of signal assignments S.

All signal assignments $s_i$ of a set of signal assignments S are checked against all formal properties $p_j$ of the set of formal properties P in the manner described above. If a signal assignments $s_i$ can not be determined as covered or uncovered, it may be marked "unknown" or "undetermined" in a simple example. Thus each one of the signal assignments $s_i$ of the set of signal assignments S can be assigned or marked with "covered", "uncovered" or "unknown". Besides this simple example further information can be added to the "unknown" signal assignments as will be explained later. For example it can be noted that no counter example could be found with a certain number of formal properties $p_i$. Alternatively, it is also possible to determine a number of steps from reset for which each formal property $p_i$ could not be disproven. The minimum of such numbers may be indicated for $s_i$.

Figure 2:
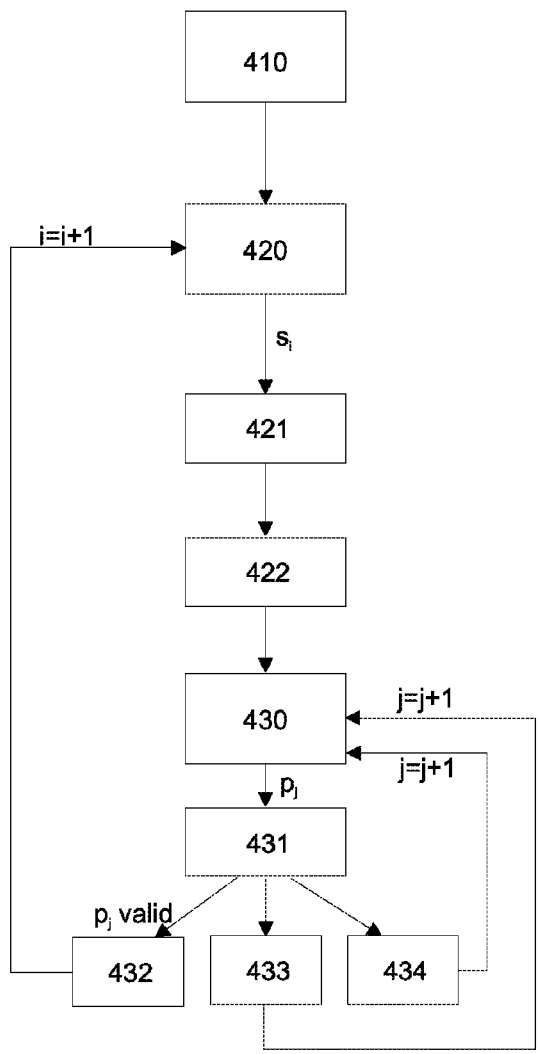
FIG. 2 shows an example of the coverage analysis method.

A simplified example of the coverage method algorithm 400 is shown in FIG. 2 and comprises the steps:
1. Mark all signal assignments $s_i$ of S as "unknown" (410)
2. For all signal assignments $s_i$ of the set of signal assignments S; (420)
 a. Replace in the description D of the digital circuit design 2 on the right hand side of the signal assignment $s_i$ with a free variable v resulting in a free variable signal assignment $s_i\_v$ and a modified description $D\_s_i\_v$. (421)
 b. Mark $s_i$ as "uncovered" (422)
 c. For all formal properties $p_j$ from a set of formal properties P (430)
  i. Formally verify if $p_j$ is valid on the modified description $D\_s_i\_v$, eventually under certain constraints C. (431)
  ii. If $p_j$ is invalid, mark $s_i$ as "covered" and continue with step 2. (432)
  iii. If $p_j$ is valid, continue with step c) (433)
  iv. If $p_j$ is neither valid nor invalid, mark $s_i$ as "unknown" and continue with step c) (434)

At the end of the above method all signal assignments $s_i$ of the set of signal assignments S will be marked "covered", "uncovered" or "unknown". As will be described later, some of the signal assignments marked as "unknown" in this example contain more information that can be added as will be explained later.

A lower limit C_l and an upper limit C_u can be determined for the coverage of a set of signal assignments S by a set of formal properties P. The lower coverage boundary C_l can be: C $$C\_l = |\{s_i: \text{mark}(s_i) = \text{"covered"}\}|/|S|$$

and the upper coverage boundary C_u may be $$C\_u = |\{s_i: \text{mark}(s_i) = \text{"uncovered"}\}|/|S|$$

The above description assumes that the coverage analysis is repeated for each signal assignment $s_i$ with all $p_j$ of the set of formal properties P until the complete set of signal assignments S has been analysed. While the above method may be performed with a random order of formal properties $p_i$ and a random order of signal assignments $s_i$ the order may be optimised for accelerating the coverage analysis. For example formal properties may be preferred, that are more likely to cover a signal assignment.

Instead of simply repeating the analysis with all formal properties $p_i$ on the next signal assignment when coming back to step c), an interrelation between the formal properties or the signal assignments may be considered. In some instances coverage of signal assignment may be dependent on each other, for example a signal assignment $s_1$ may be covered if signal assignment $s_2$ is covered and so on. This may allow building rows of signal assignments in which the coverage depends on the coverage of the previous signal assignment. Using this row allow to accelerate the coverage analysis.

Assignments that are linked to each other may also be grouped and checked or analysed in groups.

FIG. 2 shows the verification environment 1 of FIG. 1 after the application of the coverage method. The specification 3 and the comparison 300 with the specification are omitted in FIG. 3. Areas of the digital circuit design 2 that have been found to be "covered" are marked in full black colour in FIG.

3. Areas left white, indicated as white circles 22 or white rectangles, 25, 26, 27, 28 in the digital circuit design 2 are areas that have not been or could not be verified. The white circles 22 indicate areas of the digital circuit design 2 that were found to be "uncovered".

While this example is given in a graphical black and white illustration, colours may be used for illustrative purposes, for example indicating those areas in green that are covered while uncovered areas are marked red and unknown areas have a different colour. The results may be further analysed for example indicating the portion of covered, uncovered and unknown statements which can indicate the progress and/or completeness of a verification process.

Figure 3:
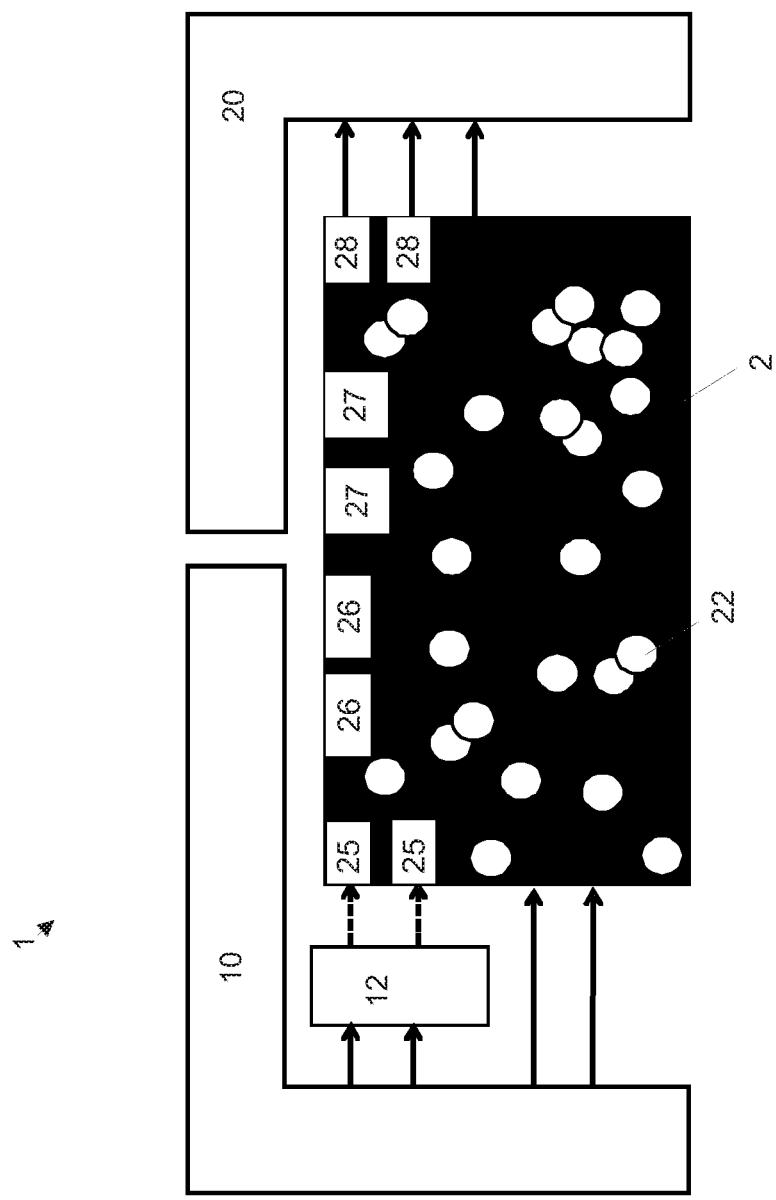
FIG. 3 illustrates the status of a verification process of a digital circuit design under verification.

Some parts of the design, however may not be investigated by or excluded from the coverage analysis method of the present disclosure, indicated by rectangles, 25, 26, 27, 28 in the digital circuit design 2 of FIG. 3. Excluded parts comprise constraint excluded portions 25, unreachable portions 26, redundant portions 27 and verification specific portions 28. There may also be further reasons for excluding portions of the digital circuits design 2 from consideration because, for example this part is not yet fully designed or undergoing modifications. Excluding portion from consideration in the coverage analysis may be termed filtering. Filtering can be divided in two types, filtering of assignments and filtering of parts of the description D of the digital circuit design.

Filtering of Assignments

A digital circuit or a digital circuit design 2 may contain a number of signal assignments $s_f$ that can not be proved or can not be disproved or that do not make sense for the actual application of the digital circuit. These can be signal assignments that can not be controlled, for example signal assignments that cannot be executed by any means (dead code) in the digital circuit and are therefore unreachable. These unreachable signal assignments $s_u$ can be determined and excluded from the coverage analysis. The corresponding portion of the digital circuit design is marked as unreachable portion 26 in FIG. 3. The corresponding code that can not be reached and can be marked accordingly as dead code (Xd).

Some of the signal assignments may also not be reached under the used constraints C. The assumptions or constraints 12 that take into consideration the environment of the digital circuit and that exclude stimuli that may never occur in practise. These stimuli or constraints 12 and the corresponding statements in the digital circuit design 2 can be excluded by filtering and excluding the corresponding constrained signal assignments $s_c$ from consideration. This corresponding portion excluded in the digital circuit design 2 may be termed constrained excluded portion 25. Signal assignments that are not reachable under the applied constraints can be marked and the corresponding code may be marked, for example with Xc.

Signal assignment may also be excluded for other reasons.

The subsequent coverage analysis will only consider signal assignments $s_i$ that are not marked with an Xd, Xc or X for any other exclusion. This accelerates coverage analysis. Furthermore the indication of signal assignments as stating to dead codes or to signal assignments that cannot be reached under the constraints can give an interesting information for the user, for example signal assignments that cannot be reached under the applied constraints (Xc) can indicate that the constraints $c_i$ are not optimised and possibly overlimit the application of stimuli.

Filtering of Code

Besides the filtering of signal assignments it is also possible to filter certain parts of the representation D of the digital circuit design 2. For example, verification code that is not used and that does not describe the actual and relevant behaviour of the digital circuit design 2 can be omitted from consideration in coverage analysis. For example, the verification code, i.e. the RTL code may contain parts that are only inserted for verification purposes. This code and statements is not relevant for the functionality of the digital circuit. This parts of the RTL description comprise for example test registers, test signals and other functions that have no influence on the digital circuit design. The corresponding excluded portion of the digital circuit design 2 is shown as verification specific portion 28 in FIG. 3.

Furthermore description of the digital circuit may comprise redundant statements or code that can also be excluded from consideration in the coverage analysis. Redundant statements are for example signals or registers that are described but are never read. The corresponding excluded portion of the digital circuit design 2 is shown as redundant portion 27 in FIG. 3.

Besides the filtering of portions of the signal assignment it is also possible to limit or exclude signal assignments for other reasons. For example a user may exclude a number of signal assignments if the user knows that these signal assignments may cause problems or are not fully designed.

All of the above filters can be combined or used depending on each other. For example it is possible that a redundant statement in the description of the digital circuit is in the same time not controllable. For example it is possible to first filter and exclude dead code Xd and constrained code Xc in a first filtering and then exclude redundant statements and verification statements from the coverage analysis in a second filtering. All filtering steps may be done prior to starting coverage analysis as described above.

While the above method has been described in a general manner applicable to may many types of descriptions D of digital circuits, the method may advantageously implemented in the RTL code. The system and method may first read the RTL code of the digital circuit design 2 and generate a syntax tree. A single static assignment form is generated for each sequential part of the syntax tree such that multiple assignments to the same variable are treated as different steps. This is for example applicable in the case of loops. Then, an intermediate variable or assignment variable is added for each signal assignment $s_i$ on the right side of the assignment. The assignment variables are also marked in the original RTL code together with the position of the assignment. The position may be for example the file name, the line number and the column of the assignment in order to distinguish multiple assignments in one line.

The following examples show the above principle in a simplified form. It is evident to a person skilled in the art that a simplified form is used for illustrative purposes only and that almost all digital circuit actually used with the present method will be far more complex.

Example 1

1. Pseudo code, sequentially with three signal assignments
   x := 3;
   a := 2*x;
   x := a;
2. Pseudo code, single static assignment
   x_1 := 3;
   a_1 := 2*x_1;
   x_2 := a_1;

-continued

3. Pseudo code, with assignment-variables
   x_a1 := 3; // line 1
   x_1 := x_a1;
   a_a1 := 2*x_1; // line 2
   a_1 := a_a1;
   x_a2 := a_1; // line 3
   x_2 := x_a2;

Example 2

1. Pseudo code, sequentially with one signal assignment
   x[0] <= 1;
   for (integer i = 1; i <= 2; ++i) {
   x[i] <= 2*x[i−1];
   }
2. Pseudo code, single static assignment
   x_1[0] := 1;
   i_1 := 1;
   x_2[i_1] := 2*x[i_1−1];
   i_2 := 2;
   x_2[i_2] := 2*x[i_2−1];
3. Pseudo code, with assignment variables
   x_a1 := 1; // line 1
   x_1[0] := x_a1;
   i_a1 := 1; // line 2
   i_1 := i_a1;
   x_a2 := 2*x[i_1−1]; // line 3
   x_2[i_1] := x_a2;
   i_a2 := 2; // line 2
   i_2 := i_a2;
   x_a3 := 2*x[i_2−1]; // line 3
   x_2[i_2] := x_a3;

The pseudo code with assignment variables is functionally equivalent to the original digital circuit design described by the RTL code, i.e. the behaviour at registers and outputs of models synthesised from both descriptions are identical. There is a unique assignment variable assigned to each signal assignment $s_i$ in a single static assignment form. It is possible that a plurality of assignment variable exists for a signal assignment $s_i$ in the original code. There is exactly one signal assignment $s_i$ in the original code for each assignment variable. All assignment variables are marked with the position of the original signal assignment.

The pseudo code can be used to generate a verification model, such as a finite state machine (FSM), for example in form of a synthesised digital circuit. The generation of the verification model can comprise a hierarchical model and/or a so called flat model. A hierarchical model comprises modules and references in the modules referring to sub instances of other modules. The hierarchical model maintains a relation of the assignments and the assignment variables and each assignment variable is present only once.

A flat model comprises references that are resolved to model instances, i.e. the content of a module replaces the reference. This involves copying of assignment variables corresponding to the number of module instances. The module instances are additionally marked with instance name or instance parts. An example of these modules is given below.

Model Generation for Coverage Analysis

In one example of the algorithm one or more of the signal assignments or groups of signal assignments are replaced by free variables v or free inputs. This can be done during synthesis or generation of a formal model based on the hierarchical model or on the flat model. This has the advantage that the model generation step has to be carried out once only and the insertion of the free variable is performed in the same step.

As an alternative the modification with assignment variables can be limited to only some or one of the signal assignments and the model generation in step 2a can be repeated.

Alternatively all assignment variables can be replaced by free variables in one single step and additional verification constraints can be inserted constraining that free variables that are not examined have the same value. This would have the advantage that flat models are also generated once and the algorithm comes very flexible if appropriate constraints are implemented.

In one example all assignment variables x_ai which relate to a variable v and which have the same line marker are grouped for analysis. This involves grouping assignment variables from different modules. The insertion of free variables may be then implemented in a way that a group of assignment is considered. This has the advantage that the covered analysis corresponds well to the assignments in the source code. If there is at least one instance in a module in which an assignment is covered the whole assignment is considered covered.

Alternatively or in addition to this modular coverage analysis, coverage analysis may be performed in an instance per instance manner. In this example the assignment variables are not grouped in different instances but are considered separately. This makes the coverage analysis more precise but requires more resources and calculation time.

Modular coverage analysis and coverage analysis by instances can be combined. In a first step the analysis may be carried out in the modular manner if a signal assignment is not covered in this modular analysis it would not be covered in an instance by instance analysis. Only those signal assignments that are covered in the modular analysis are further analysed in an instance by instance manner. It is possible that cases exist where coverage is determined in a modular analysis but an instance by instance analysis may reveal that the signal assignment is not covered.

Depth Indication of Undetermined Coverage

As indicated above there may be some cases in which a signal assignment $s_i$ cannot disprove a formal property $p_j$ and it is not possible to prove all formal properties $p_j$ of a set of formal properties P. In this case the result or indication may be "undetermined"/"unknown" in the simplest case. However, a number m of formal properties $P_p$ may have been proved for a signal assignment s with the free variable v. The information can be output, indicated as lower limit number m of formal properties, that are proven for the signal assignment $s_i$. At the same time, a number k of properties $P_k$ remains undetermined for $s_i$, i.e. they are neither proven nor disproven. In this case each formal property $p_j$ of $P_k$ is not disproven for a number $n_j$ of steps from reset. If n is the minimum of such $n_j$ then the signal assignment $s_i$ cannot be covered in n steps. The information can be output, indicated and/or can be used further. This information can be used for example for debugging of the digital circuit design 2 or for further verification steps. This information may also be used to increase the resources for the checker or for modifying constraints $c_i$ or other input parameters.

Furthermore, the present disclosure is not necessarily limited to formal verification, formal properties and formal constraints. Although formal properties and formal constraints are advantages with the present disclosure, other forms of a digital circuit description describing the digital circuit design may be equally used with the present disclosure.

It should be understood that different aspects and examples have been described in the detailed description. A person skilled in the art will understand that not all of the features are necessary to implement the present invention and that several aspects can be omitted or combined in any manner.

The invention claimed is:

1. A method for providing information relating to a verification of a digital circuit by using a computer, wherein the formal verification comprises verifying that a plurality of properties (P) is valid for a representation (D) of the digital circuit, the method comprising:
   a) replacing, at least a first input value (s) relating to the representation of the digital circuit by a first free variable (v);
   b) determining, by using said computer, when at least one of the plurality of properties is valid or invalid after replacing the first input value by the first variable (v); and
   c) indicating when the at least one of the plurality of properties is valid or invalid wherein the determining when at least one of the plurality of properties is valid or invalid comprises determining when at least one of the plurality of properties is disproved with the first free variable, and wherein the indicating when the at least one of the plurality of properties is valid or invalid comprises indicating that the first input value (s) is covered if at least one of the plurality of properties is disproved.

2. The method for providing information relating to a verification of a digital circuit according to claim 1, wherein the indicating when the at least one of the plurality of properties is valid or invalid comprises indicating that a coverage of the first input value (s) is not determined when none of the plurality of properties is disproved and at least one of the plurality of properties (P) cannot be proven.

3. The method for providing information relating to a verification of a digital circuit according to any one of claims 1, wherein the indicating when the at least one of the plurality of properties is valid or invalid comprises indicating that a coverage of the first input value (s) is determined to a lower limit when none of the plurality of properties is disproved and one or more of the plurality of properties (P) cannot be proven.

4. The method for providing information relating to a verification of a digital circuit according to claim 1, wherein the verification is a formal verification and the set of properties is a set of formal properties.

5. The method for providing information relating to a verification of a digital circuit according to claim 1, wherein the first input value is a first signal assignment.

6. The method for providing information relating to a verification of a digital circuit according to claim 1, further comprising repeating the method steps with at least a second signal assignment.

7. The method for providing information relating to a verification of a digital circuit according to claim 1, further comprising excluding one or more signal assignments from the representation of the digital circuit.

8. The method for providing information relating to a verification of a digital circuit according to claim 1, further comprising excluding at least one portion of the description of the digital circuit from the method that has no influence on the functionality of the digital circuit.

9. The method for providing information relating to a verification of a digital circuit according to claim 1, wherein the representation of the digital circuit comprises a plurality of statements relating to the functional behaviour of the digital circuit, and wherein the method further comprises indicating when one or more statements of the plurality of statements are covered, uncovered, not determined or a combination thereof.

10. The method for providing information relating to a verification of a digital circuit according to claim 1, wherein the representation of the digital circuit comprises a Register Transfer List (RTL) code with a plurality of statements.

11. The method for providing information relating to a verification of a digital circuit according to claim 1, further comprising indicating all input variables as undefined prior to the replacing of at least one first input value ($s_i$) assigned to the representation of the digital circuit by a free variable (v).

12. The method for providing information relating to a verification of a digital circuit according to claim 1, further comprising at least one constraint relating to one or more properties.

13. A computer program product stored in a memory for providing information relating to a verification of a digital circuit, the computer program product executing the method according to method of claim 1.

14. A method for providing information relating to a verification of a digital circuit by using a computer, wherein the formal verification comprises verifying that a plurality of properties (P) is valid for a representation (D) of the digital circuit, the method comprising:
   a) replacing, at least a first input value (s) relating to the representation of the digital circuit by a first free variable (v);
   b) determining, by using said computer, when at least one of the plurality of properties is valid or invalid after replacing the first input value by the first variable (v); and
   c) indicating when the at least one of the plurality of properties is valid or invalid; wherein the determining when at least one of the plurality of properties is valid or invalid comprises determining when each one of the plurality of properties (P) is proved with the first free variable and wherein the indicating when the at least one of the plurality of properties is valid or invalid comprises indicating that the first input value (s) is uncovered if each one of the plurality of properties (P) is proved.

15. A system for providing information relating to a verification of a digital circuit, wherein the verification comprises verifying that a plurality of properties (P) is valid for a representation (D) of the digital circuit, the system comprising an assignment module for replacing at least a first input value (s) relating to the representation of the digital circuit by a first free variable (v), a verifying module for determining when at least one of the plurality of properties is valid or invalid after replacing the first input value by the first free variable (v), and an indication module for indicating when the at least one of the plurality of properties is valid or invalid wherein the indicating when the at least one of the plurality of properties is valid or invalid comprises indicating that a coverage of the first input value (s) is not determined when none of the plurality of properties is disproved and at least one of the plurality of properties (P) cannot be proven.

* * * * *